United States Patent [19]
Sawano

[11] Patent Number: 6,160,829
[45] Date of Patent: Dec. 12, 2000

[54] SELF-SUSTAINED PULSATION SEMICONDUCTOR LASER

[75] Inventor: Hiroyuki Sawano, Tokyo, Japan

[73] Assignee: NEC Corporation, Tokyo, Japan

[21] Appl. No.: 09/082,191

[22] Filed: May 21, 1998

[30] Foreign Application Priority Data

May 21, 1997 [JP] Japan .................................. 9-130987

[51] Int. Cl.[7] ..................................................... H01S 5/00
[52] U.S. Cl. .............................. 372/45; 372/44; 372/45; 372/46; 372/50
[58] Field of Search .................... 372/44–46, 50

[56] References Cited

U.S. PATENT DOCUMENTS

| | | | |
|---|---|---|---|
| 4,961,197 | 10/1990 | Tanaka et al. | 372/45 |
| 5,416,790 | 5/1995 | Yodoshi et al. | 372/46 |
| 5,581,570 | 12/1996 | Yoshida et al. | 372/46 |
| 5,751,756 | 5/1998 | Takayama et al. | 372/46 |
| 5,894,491 | 4/1999 | Sawano et al. | 372/49 |
| 6,002,701 | 12/1999 | Kan et al. | 372/46 |
| 6,031,858 | 2/2000 | Hatakoshi et al. | 372/46 |
| 6,072,817 | 6/2000 | Adachi et al. | 372/45 |

FOREIGN PATENT DOCUMENTS

| | | |
|---|---|---|
| 1-173685 | 7/1989 | Japan . |
| 1-184972 | 7/1989 | Japan . |
| 2-106082 | 4/1990 | Japan . |
| 6-196810 | 7/1994 | Japan . |
| 7-263798 | 10/1995 | Japan . |
| 8-56044 | 2/1996 | Japan . |
| 9-083064 | 3/1997 | Japan . |
| 9-95936 | 4/1997 | Japan . |
| 9-129961 | 5/1997 | Japan . |
| 10321946 | 12/1998 | Japan . |

OTHER PUBLICATIONS

Ishikawa et al., Extended Abstracts of 18th Conference on Solid State Devices and Materials 1986, pp 153–156, No. D–1–2.

Hamada et al., "Proceedings of 11th Semiconductor Laser Symposium", 1994, pp 21.

Adachi et al., Self–Sustained Pulsation in 650–nm–Band AlGaInP Visible–Laser Diodes with Highly Dope Saturable Absorbing Layer, *IEEE Photonics Technology Letters*, vol. 7, No. 12, pp. 1406–1408.

Adachi et al., Proceedings of 43rd meeting, 1975, pp 1024.

Hiroyuki Sawono, Self–Sustained Pulsation at 65 C through Reduced Carrier Overflow in AlGaInP Laser Diodes, IEEE Journal (Quantum Electronics), vol. 5, No. 3, May/Jun. 1999 pp. 715–720.

Hiroyuki Sawano "Self–sustained pulsation al 65 C through reduced carrier overflow in AlGaInP Laser Diode", Semiconductor Laser Conference, 1998, ISCL, 1998 NARA. 1988 IEEE16th in 1998, p. 257–58.

*Primary Examiner*—Frank G. Font
*Assistant Examiner*—Delma R. Flores Ruiz
*Attorney, Agent, or Firm*—Foley & Lardner

[57] ABSTRACT

A self-sustained pulsation semiconductor laser device has a cladding layer including a pair of cladding layer portions, and a saturable absorbing layer and a buffer layer sandwiched between the pair of cladding layer portions. The semiconductor material for the buffer layer has an intermediate valence band energy between valence band energies of the saturable absorbing layer and the semiconductor material for the cladding layer portion in contact with the buffer layer, to reduce spikes formed in the valence band energy profile. Holes are smoothly injected to an active layer which lases in self-sustained pulsation at a high yield.

22 Claims, 12 Drawing Sheets

SELF-SUSTAINED PULSATION SEMICONDUCTOR LASER

BACKGROUND OF THE INVENTION (a) Field of the Invention

The present invention relates to a self-sustained pulsation semiconductor laser device and, more particularly, to a self-sustained pulsation semiconductor laser device capable of operating at a low-noise.

(b) Description of the Related Art

A semiconductor laser device is widely used as a light source for an optical disk drive or an optical communication. In particular, the semiconductor laser device is recently highlighted for use in a high-density optical disk such as digital versatile disk (DVD) or magneto-optical (MO) disk. It is generally known that the semiconductor laser device used in such an optical pick-up system suffers from noise due to optical feedback from the optical disk surface. It is therefore important in the semiconductor laser device to suppress the optical feedback noise.

Driving the semiconductor laser device with a high frequency is known as one of the methods for decreasing the noise. Specifically, such a high-frequency drive of a semiconductor laser device provides multi-mode oscillation spectrum to thereby decrease the influence by the optical feedback. However, there arises in this technique a problem radiation of electromagnetic wave noise in addition to rise of the cost thereof, because of necessity for incorporation of a high-frequency superimpose module.

On the other hand, a self-sustained pulsation laser device has an advantage of absence of electromagnetic wave noise in addition to the advantages of low costs and a low-noise characteristic compatible with the high-frequency drive. Accordingly, a self-sustained pulsation semiconductor laser device having a low threshold current and a long-term reliability is especially desired.

The self-sustained pulsation can be obtained by incorporating a saturable absorber in the laser resonator to control the amount of the saturable absorption. Such a self-sustained pulsation and the laser structure therefor are reported in "Extended Abstract of 18th Conference on Solid State Devices and Materials", page 153, No. D-1-2, 1986, and in "Proceedings of 11th Semiconductor Laser Symposium", page 21, 1994. The semiconductor laser proposed in these papers has a saturable absorbing layer implemented by a portion of an active layer disposed under the current blocking layer. The proposed semiconductor laser has, however, a problem of a large astigmatism which is as high as between 10 $\mu$m and 50 $\mu$m due to a large optical absorption at the side of the mesa stripe.

Patent Publication JP-A-6-196810 proposes reduction of astigmatism by the configuration shown in FIG. 8, wherein a saturable absorbing layer is provided parallel to the active layer as a part of a cladding layer. In FIG. 8, n-AlGaAs cladding layer 103, n-type saturable absorbing layer 104, n-AlGaAs cladding layer 105, active layer 106, p-AlGaAs cladding layer 107, p-type saturable absorbing layer 108, p-AlGaAS cladding layer 109, p-GaAs cap layer 110, p-GaAs contact layer 111, n-GaAs current blocking layer 112 and a p-electrode are formed on the top surface of a GaAs substrate 102, with an n-electrode formed on the bottom surface of the GaAs substrate 102. An n-GaAs current blocking layer embeds p-AlGaAs cladding layer 109 and p-GaAs cap layer 110. In this configuration, a low optical feedback noise semiconductor device of a self-sustained pulsation and a small astigmatism is obtained by controlling the Al mole fraction (x) and thickness (between 0.01 $\mu$m and 0.04 $\mu$m) of n-Al$_x$Ga$_{1-x}$As saturable absorbing layer 104, and the composition (or Al mole fraction (x)) and thickness (between 0.01 $\mu$m and 0.04 $\mu$m) of p-Al$_x$Ga$_{1-x}$As saturable absorbing layer 108.

"IEEE Photonics Technology Letters", vol7, No12, pp1406, December 1995 describes a self-sustained pulsation semiconductor device, wherein a saturable absorbing layer, which is provided as a part of p-type cladding layer, is heavily doped with p-type dopant at as high as 2×10$^{18}$ cm$^{-3}$ carrier density, thereby achieving AlGaInP red laser lasing by self-excitation pulsation at temperatures up to about 50° C.

"Proceeding of 43rd Meeting for Applied Physics Association", page 1024, 26a-C-10 describes a self-sustained pulsation lasing at a higher temperature and obtained by reducing the bandgap of a saturable absorbing layer compared to the bandgap of the active layer.

The semiconductor laser devices as proposed above have a disadvantage in that the yield (good products/total products) of semiconductor lasers capable of lasing by self-sustained pulsation is as low as on the order of 10%, according to experiments conducted by the inventor.

SUMMARY OF THE INVENTION

In view of the above it is an object of the present invention to provide a semiconductor laser device capable of lasing by self-sustained pulsation with a low optical feedback noise and a low astigmatism, and can be manufactured with a high yield.

The present invention provides a semiconductor device comprising a first conductivity-type semiconductor substrate, and a first conductivity-type cladding layer, active layer and a second conductivity-type cladding layer consecutively formed on the semiconductor substrate, at least one of the first conductivity-type cladding layer and the second conductivity-type cladding layer including therein a saturable absorbing layer having first and second surfaces, a first buffer layer disposed in contact with the first surface of the saturable absorbing layer, and first and second cladding layer portions sandwiching therebetween the saturable absorbing layer and the first buffer layer, a semiconductor material for the saturable absorbing layer having a first bandgap energy which is lower than a second bandgap energy of a semiconductor material for the first and second cladding layer portions, a semiconductor material for the first buffer layer having an intermediate valence band energy between the first valence band energy and the second valence band energy.

The present invention also provides a semiconductor laser device comprising a first conductivity-type semiconductor substrate, and a first conductivity-type cladding layer, active layer and a second conductivity-type cladding layer consecutively formed on the semiconductor substrate, at least one of the first conductivity-type cladding layer and the second conductivity-type cladding layer including therein a saturable absorbing layer having first and second surfaces, a first buffer layer disposed in contact with the first surface of the saturable absorbing layer, and first and second cladding layer portions sandwiching therebetween the saturable absorbing layer and the first buffer layer, the saturable absorbing layer having a first bandgap energy which is lower than a second bandgap energy of the first and second cladding layer portions, the first buffer layer having an intermediate bandgap energy between the first bandgap energy and the second bandgap energy.

In accordance with the semiconductor laser device of the present invention, the first buffer layer alleviates the bandgap energy difference between the saturable absorbing layer and the cladding layer, thereby reducing the spikes in the valence band energy of the saturable absorbing layer. As a result, lasing of the semiconductor laser device occurs in the active layer and not in the saturable absorbing layer. Thus, the saturable absorbing layer can operate for saturable absorption function to allow the semiconductor device to lase by self-sustained pulsation.

The above and other objects, features and advantages of the present invention will be more apparent from the following description, referring to the accompanying drawings.

PREFERRED EMBODIMENTS OF THE INVENTION

Before describing the preferred embodiments of the present invention, the cause of the disadvantages of the conventional techniques is investigated by experiments.

Figure 1:
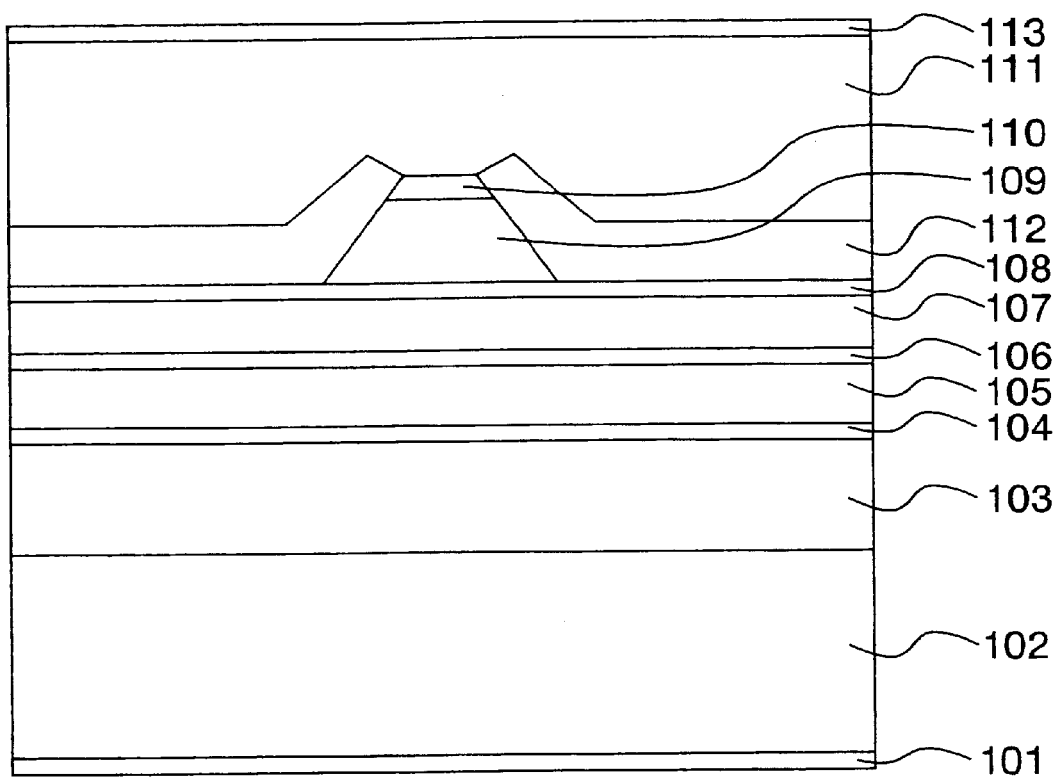
FIG. 1 is a cross-sectional view of a conventional self-sustained pulsation semiconductor laser device.
Figure 2:
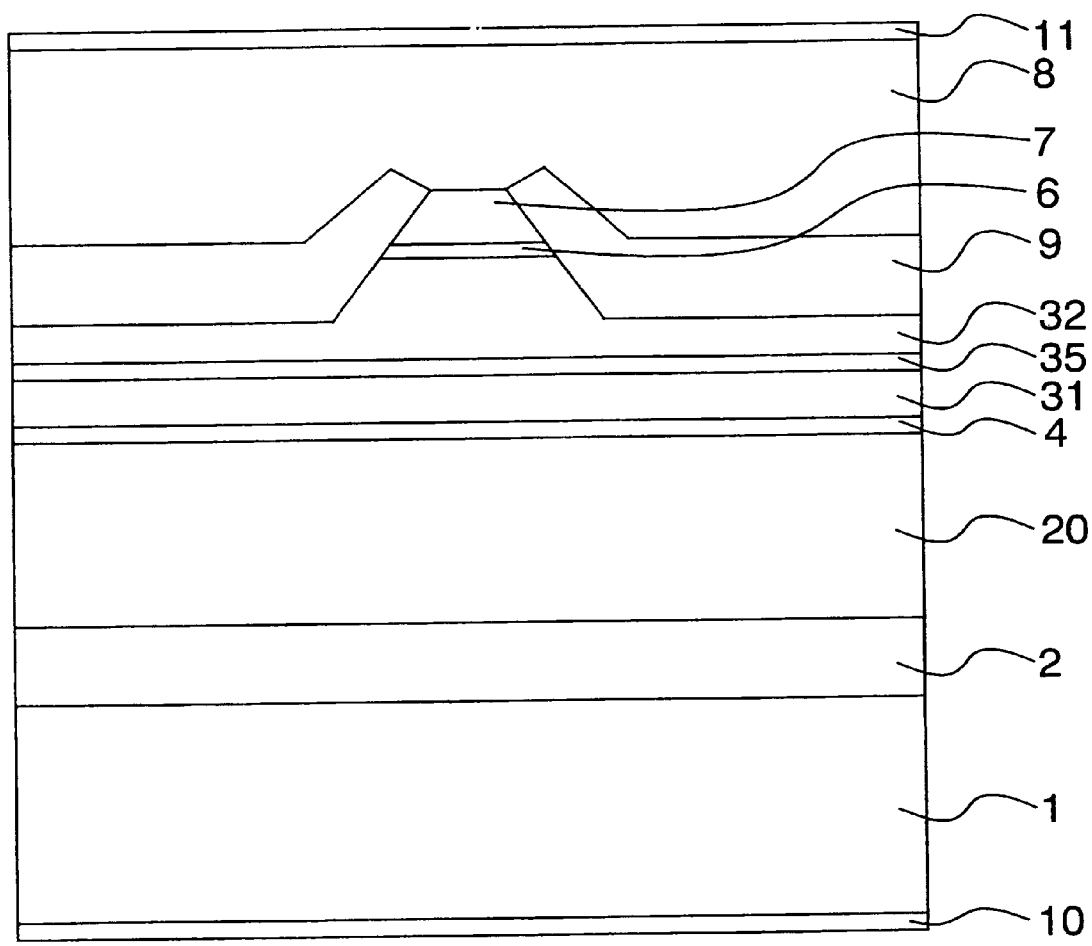
FIG. 2 is a cross-sectional view of another conventional self-sustained pulsation semiconductor laser device.

A conventional self-sustained pulsation semiconductor laser device shown in FIG. 2 was fabricated, wherein GaAs buffer layer 2, n-AlGaInP cladding layer 20, active layer 4, a p-cladding layer including a p-AlGaInP cladding layer portion 31, p-saturable absorbing layer 35 and p-AlGaInP cladding layer portion 32, GaInP hetero-junction buffer layer 6, p-GaAs cap layer 7, p-GaAs cap layer 8, and p-electrode 11 are consecutively formed on the top surface of a GaAs substrate 1, with an n-electrode 10 formed on the bottom surface of the GaAs substrate 1. A mesa-stripe structure formed by a portion of p-AlGaInP cladding layer portion (hereinafter, simply referred to as p-AlGaInP cladding layer) 32 and GaInP hetero-junction buffer layer 6 and p-GaAs cap layer 7 is embedded by an n-GaAs current blocking layer 9.

Figure 3:
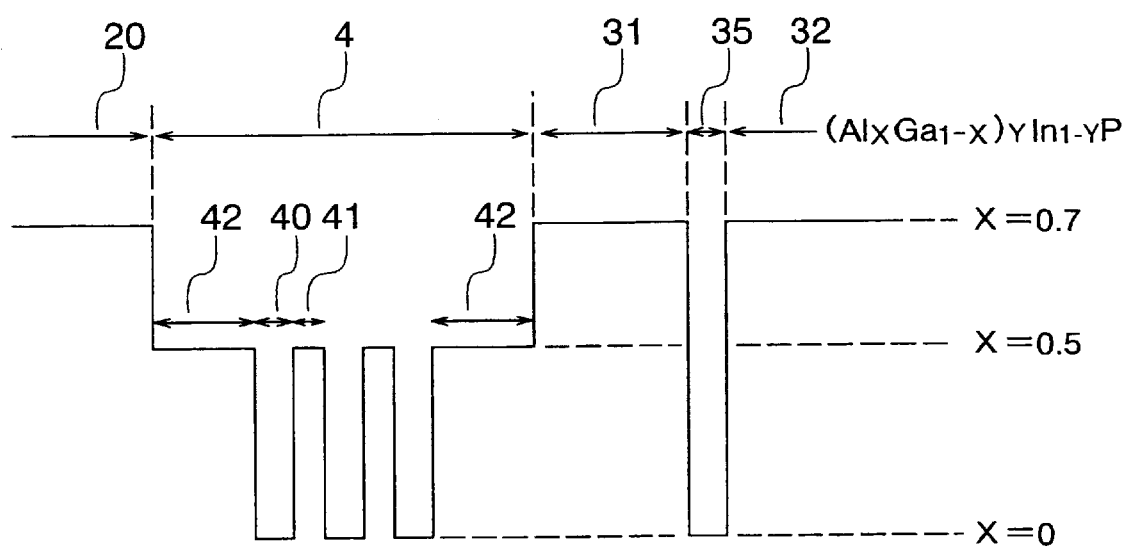
FIG. 3 is an Al mole fraction profile of the conventional laser device of FIG. 2;.

FIG. 3 illustrates a composition profile of the semiconductor laser of FIG. 2, shown as an Al mole fraction (x) profile of $(Al_xGa_{1-x})_yIn_{1-y}P$ in the layers from n-AlGaInP cladding layer 20 to the saturable absorbing layer 35. Specifically, the active layer 4 is formed by three GaInP quantum well layers 40 each including 0.25%-compressive-strained GaInP and having a thickness of 6 nm, a pair of AlGaInP barrier layers 41 each sandwiched between adjacent quantum well layers 40 and having a thickness of 4 nm and an Al mole fraction of 0.5, and a pair of optical guide layers 42 sandwiching therebetween the three quantum well layers 40 and the pair of barrier layers 41. The optical guide layers 42 are provided at both p-side and n-side of the active layer 4, and each has a thickness of 50 nm and an Al mole fraction (x) of 0.5, as shown in the drawing.

N-AlGaInP cladding layer 20 has a thickness of 1.2 μm, Al mole fraction of 0.7 and an electron (carrier) density of $5 \times 10^{17}$ cm$^{-3}$. P-AlGaInP cladding layer 31 has a thickness of 100 nm, Al mole fraction of 0.7 and a hole (carrier) density of $5 \times 10^{17}$ cm$^{-3}$. P-AlGaInP cladding layer 32 has a thickness of 1.1 μm, Al mole fraction of 0.7 and a hole density of $5 \times 10^{17}$ cm$^{-3}$. P-saturable absorbing layer 35 has a compressive strain of 0.78%, a thickness of 6 nm and a hole density of $2 \times 10^{18}$ cm$^{-3}$.

Figure 4A:
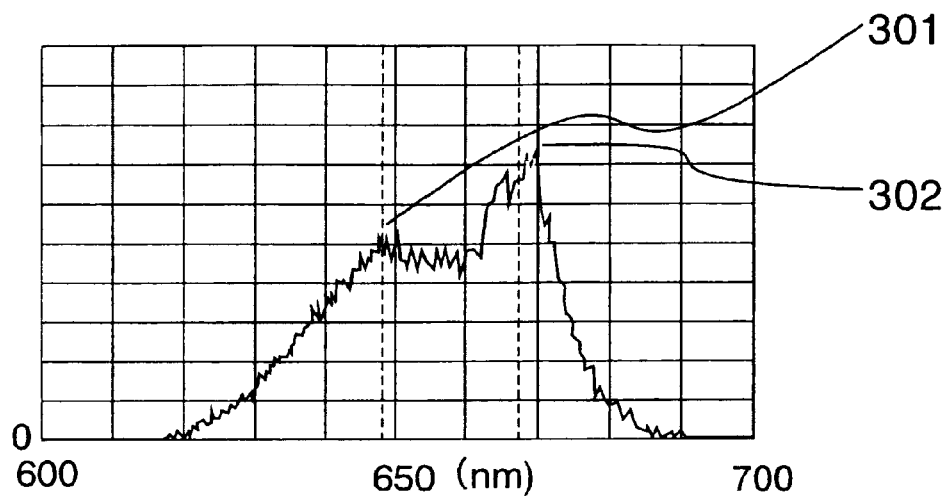
FIGS. 4A and 4B are optical spectra of the laser device of FIG. 2 during operation for electro-luminescence and lasing thereof, respectively.

FIG. 4A shows the optical spectrum of the laser device of FIG. 2 measured during electro-luminescence thereof at a driving current of 80 mA, wherein energy peaks 301 and 302 were observed at wavelengths of 648 nm and 667 nm, respectively. The emission centers were investigated based on the difference between the compressive strains of 0.25% in active layer 4 and of 0.78% in the saturable absorbing layer 35, and revealed that the peak 301 at the wavelength of 648 nm originated from the emission in the active layer 4 and that the peak 302 at the wavelength of 667 nm originated from the emission in the saturable absorbing layer 35.

Figure 4B:
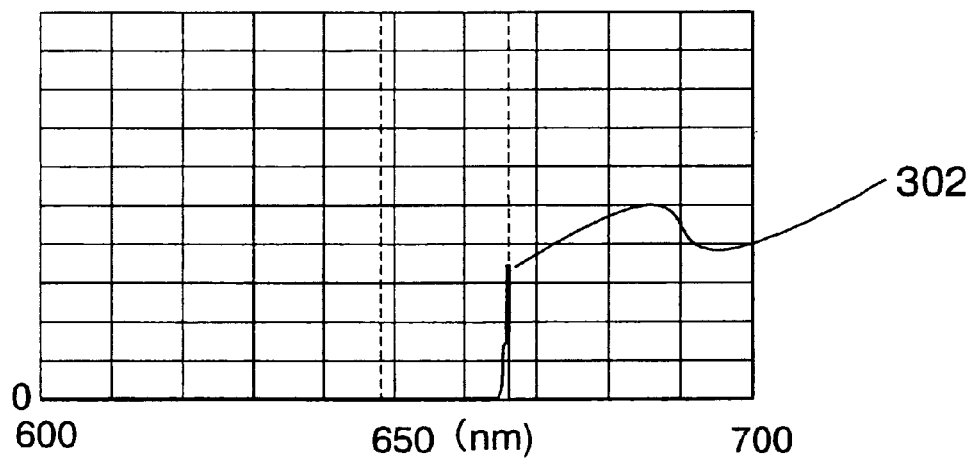

FIG. 4B shows another optical spectrum of the semiconductor device of FIG. 2 measured during lasing thereof at a driving current of 100 mA and an optical output of 5 mW, which revealed only the peak 302 at the wavelength of 667 nm which coincided with the wavelength of the emission from the saturable absorbing layer 35. From these results, it was found that lasing was effected in the saturable absorbing layer 35 and not in the active layer 4.

From the above fact, a presumption is established by the inventor as to the lasing operation of the semiconductor laser of FIG. 2 as follows.

A discontinuity in the hetero-junction interface is generally determined by the energy level of the valence band of each semiconductor material before the junction. FIG. 5B illustrates the band structure of the semiconductor laser device of FIG. 2 plotted in association with the bandgap profile of FIG. 5A which is the same as FIG. 3. In FIG. 5B, the steps in the conduction band energy results from a valence band energy difference between semiconductor materials for the saturable absorbing layer 35 and the cladding layers 31 and 32, all of which are p-type layers to substantially equalize the valence band energy in the resultant semiconductor lasers. It is to be noted that the valence band energy difference between the semiconductor materials for the saturable absorbing layer and the cladding layers appears as a step in the bandgap energy profile.

The hetero-junction interface between the saturable absorbing layer 35 and p-AlGaInP cladding layer 31 involves a spike 311 in the valence band energy, as shown in FIG. 5B, which retards holes having a larger effective mass from entering the p-AlGaInP cladding layer 31. As a result, a large number of holes stay in the saturable absorbing layer 35 to generate an undesirable electric field, which attracts electrons from the active layer 4 to the saturable absorbing layer 35. Thus, the holes and electrons accumulated in the saturable absorbing layer 35 are recombined therein for lasing.

In view of the above, the present invention employs a structure for reducing the spike between the saturable absorbing layer 35 and the cladding layer 31 and/or 32 by interposing therebetween a valence band energy buffer layer for alleviating the discontinuity. The valence band energy buffer layer retards holes from staying in the saturable absorbing layer 35 to assist injection of the holes into the active layer 4, whereby lasing can be obtained in the active layer 4 and not in the saturable absorbing layer 35.

Figure 5A:
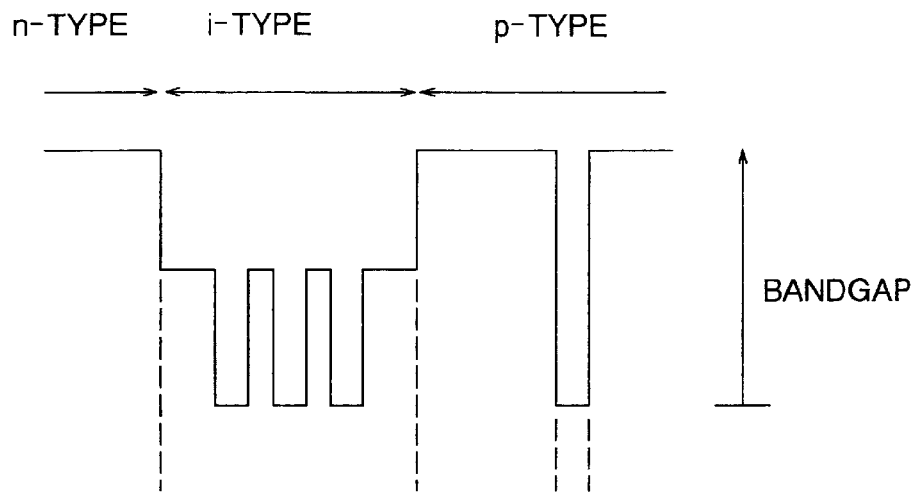
FIGS. 5A and 5B are a bandgap profile and a band structure diagram, respectively, of the laser device of FIG. 2.
Figure 5B:
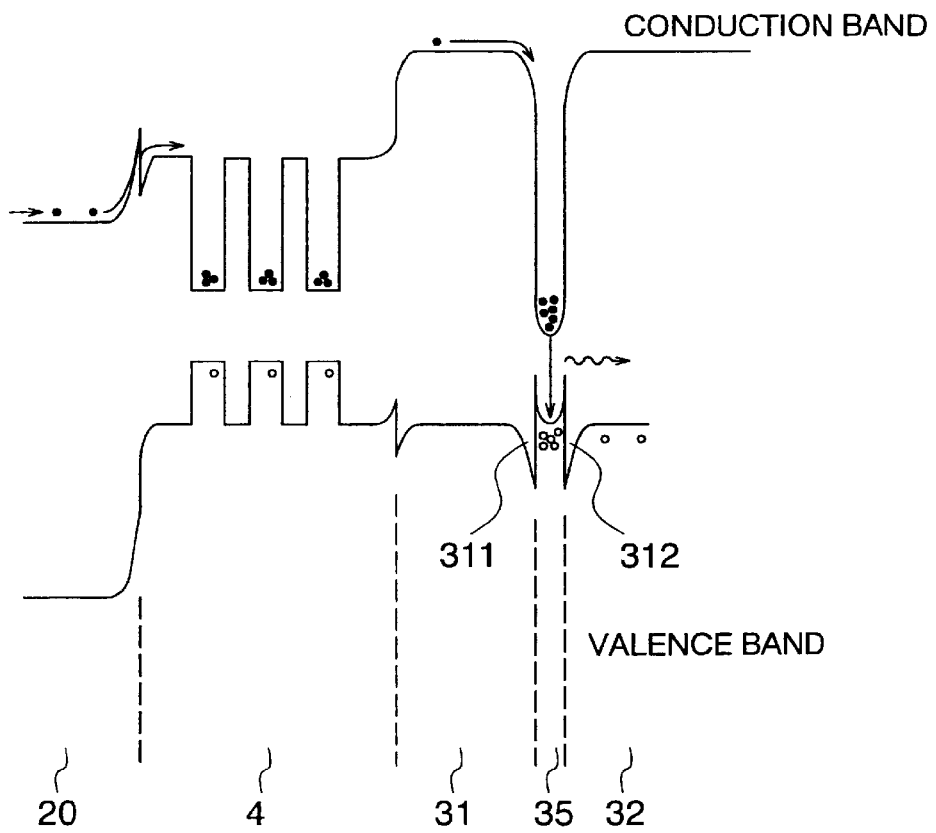

The bandgap profile of FIG. 5A can be also used for designing the energy discontinuity of the valence band energy if the physical properties of the layers are clear, because the bandgap profile exhibits a tendency similar to the valence band of the semiconductor materials for the layers in the view point of the energy discontinuity. For example, if both the saturable absorbing layer 35 and the cladding layer 31 or 32 are made of III-V or II-VI compound semiconductors wherein at least one element of the V or VI groups is common to both the layers, a bandgap buffer layer is interposed between both the layers to prevent holes from staying in the saturable absorbing layer at a high density. The term "bandgap buffer layer" as used herein means a layer having an intermediate bandgap between the bandgap of the saturable absorbing layer 35 and the bandgap of the cladding layer 31 or 32, wherein the intermediate bandgap may be continuous or may have discontinuity from the saturable absorbing layer 35 to the cladding layer 31 or 32.

As a measure for achieving a valence band energy buffer function or bandgap energy buffer function in the present invention, the composition of the buffer layer may have an intermediate composition between the compositions of the saturable absorbing layer 35 and the cladding layer 31 or 32, wherein the intermediate composition may be continuous or may have a discontinuity from the saturable absorbing layer 35 to the cladding layer 31 or 32.

The term "intermediate composition" as used herein means that the mole fraction of each element in the intermediate layer resides at an intermediate value between the mole fraction of the each element in the saturable absorbing layer 35 and the mole fraction of the each element in the cladding layer 31 or 32, wherein the "intermediate value" includes the value substantially equal to either of both the mole fractions, and yet the intermediate layer has a significant difference in the composition between the same and either the saturable absorbing layer 35 or the cladding layer 31 or 32. For example, if the saturable absorbing layer 35 and the cladding layer 31 or 32 have compositions of $III^a V^a$ and $III^b V^b$, respectively, wherein $III^a$ and $III^b$ are different elements in III-group and $V^a$ and $V^b$ are different elements in V-group, the intermediate buffer layer have a composition of:

$$III^a_x III^b_{1-x} V^a_y V^b_{1-y},$$

Wherein $0 \leq x \leq 1$, $0 \leq y \leq 1$, and both x and y do not assume 0 or 1 in one intermediate buffer layer.

Further, as a specific example, if the saturable absorbing layer 35 and the cladding layer 31 or 32 have compositions of $Ga_{0.4}In_{0.6}P$ and $(Al_{0.7}Ga_{0.3})_{0.52}In_{0.48}P$, respectively, the intermediate buffer layer has a composition of $(Al_x Ga_{1-x})_y In_{1-y} P$ wherein $0 \leq x \leq 0.7$, $0.4 \leq y \leq 0.52$, and yet x and y are selected so that the intermediate buffer layer does not have the same composition as that of either the saturable absorbing layer 35 or the cladding layer 31 or 32.

Now, the present invention is more specifically described with reference to accompanying drawings, wherein similar constituent elements are designated by the same or similar reference numerals.

Figure 6:
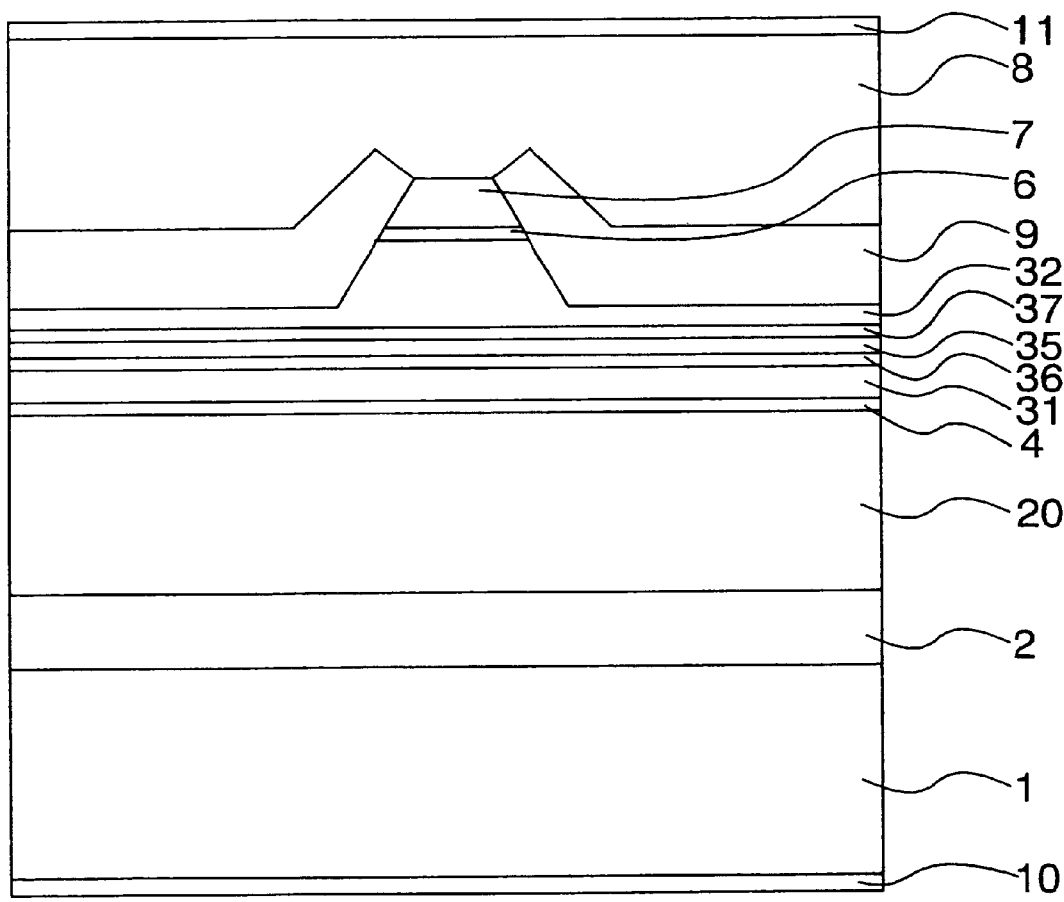
FIG. 6 is a cross-sectional view of a self-sustained pulsation semiconductor laser device according to a first embodiment of the present invention.

Referring to FIG. 6, a semiconductor laser device of a first embodiment of the present invention comprises GaAs buffer layer 2, n-AlGaInP cladding layer 20, active layer 4, p-AlGaInP cladding layer 31, p-type first valence band energy buffer layer 36, p-type saturable absorbing layer 35, p-type second valence band energy buffer layer 37, p-AlGaInP cladding layer 32, GaInP hetero-junction buffer buffer layer 6, p-GaAs cap layer 7, p-GaAs cap layer 8, and p-electrode 11 consecutively formed on the top surface of a GaAs substrate 1, and an n-electrode 10 formed on the bottom surface of the GaAs substrate 1. A mesa stripe structure formed by a portion of p-AlGaIn cladding layer 32 and GaInP hetero-junction buffer layer 6 and p-GaAs cap layer 8 is embedded by an n-GaAs current blocking layer 9.

The semiconductor laser device of the present embodiment was fabricated as follows. First, GaAs buffer layer 2, n-AlGaInP cladding layer 20, active layer 4, p-AlGaInP cladding layer 31, p-type first valence band energy buffer layer 36, p-type saturable absorbing layer 35, p-type second valence band energy buffer layer 37, p-AlGaInP cladding layer 32, GaInP hetero-junction buffer layer 6, p-GaAs cap layer 7 were grown on the top surface of a GaAs substrate 1 by using a low pressure metal-organic vapor phase epitaxy (LPMOVPE).

Subsequently, GaInP hetero-junction buffer layer 6, p-GaAs cap layer 7 and a top portion of p-AlGaIn cladding layer 32 were selectively etched by a photolithographic etching technique using a $SiO_2$ film as a mask to form a mesa stripe.

Thereafter, n-GaAs current blocking layer 9 was selectively grown using the $SiO_2$ film as a mask to embed the mesa stripe. After removing the $SiO_2$ film, p-GaAs cap layer 8 was grown by LPMOVPE. Subsequently, p-electrode 11 was formed on the p-GaAs cap layer 8, followed by grinding the GaAs substrate 1 at the bottom surface thereof to obtain a suitable thickness and forming an n-electrode 10 thereon to complete the structure shown in FIG. 6.

Trimethyl aluminum, triethyl gallium, trimethyl indium, phosphine and arsine were used as the source materials for the LPMOVPE, disilane was used for an n-type dopant, and diethyl zinc was used for a p-type dopant. The growth temperature, the growth pressure and the ratio of a supplied source amount for V-group to a supplied source amount for III-group were 660° C., 70 Torr and 500, respectively.

Figure 7:
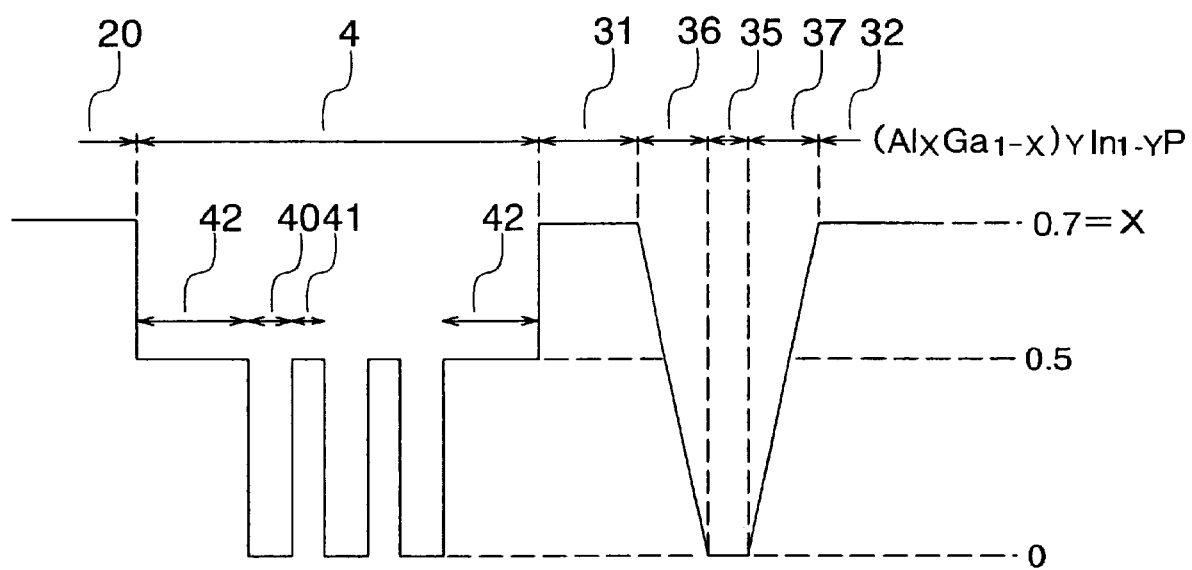
FIG. 7 is an Al mole fraction profile of the laser device of FIG. 6.

FIG. 7 shows an Al mole fraction (x) profile in the layers from n-AlGaInP cladding layer 20 to the saturable absorbing layer 35.

The active layer 4 comprised three GaInP quantum well layers 40 each having a compressive strain of 0.25% and a thickness of 6 nm, a pair of AlGaInP barrier layers 41 each interposed between corresponding adjacent two of GaInP quantum well layers 40 and each having a thickness of 4 nm and an Al mole fraction (x) of 0.5, and a pair of optical guide layers 42 sandwiching therebetween GaInP quantum well layers 40 and AlGaInP barrier layers 41. The optical guide layer 42 were disposed at p-side and n-side of the active layer 4 and had a thickness of 50 nm and an Al mole fraction (x) of 0.5.

N-AlGaInP cladding layer 20 had a thickness of 1.2 $\mu$m, Al mole fraction of 0.7 and an electron density of $1 \times 10^{17}$ $cm^{-3}$. P-AlGaInP cladding layer 31 had a thickness of 80 nm, Al mole fraction of 0.7 and a hole density of $5 \times 10^{17}$ $cm^{-3}$ 32. P-AlGaInP cladding layer 32 had a thickness of 1.1 μm, Al mole fraction of 0.7 and a hole density of $5 \times 10^{17}$ $cm^{-3}$. P-saturable absorbing layer 35 had a compressive strain of 0.51%, a thickness of 6 nm, and a hole density (doping concentration) of $2 \times 10^{18}$ $cm^{-3}$.

The composition of p-type first valence band energy buffer layer (hereinafter, simply referred to as buffer layer if not otherwise specified) 36 was equal to the composition of p-AlGaInP cladding layer 31 at the interface between the same and p-AlGaInP cladding layer 31, equal to the composition of p-saturable absorbing layer 35 at the interface between the same and p-saturable absorbing layer 35, and linearly changed between both the interfaces.

The composition of p-type second buffer layer 37 was equal to the composition of p-AlGaInP cladding layer 32 at the interface between the same and p-AlGaInP cladding layer 32, equal to the composition of p-saturable absorbing layer 35 at the interface between the same and saturable absorbing layer 35, and changed linearly between both the interfaces.

The first buffer layer 36 had a thickness of 10 nm and hole densities of from $5 \times 10^{17}$ $cm^{-3}$ at the interface between the same and cladding layer 31 to $2 \times 10^{18}$ $cm^{-3}$ at the interface between the same and saturable absorbing layer 35. P-type second buffer layer 37 had a thickness of 10 nm, hole densities of from $5 \times 10^{17}$ $cm^{-3}$ at the interface between the same and cladding layer 32 to $2 \times 10^{18}$ $cm^{-3}$ at the interface between the same and saturable absorbing layer 35.

Figure 8A:
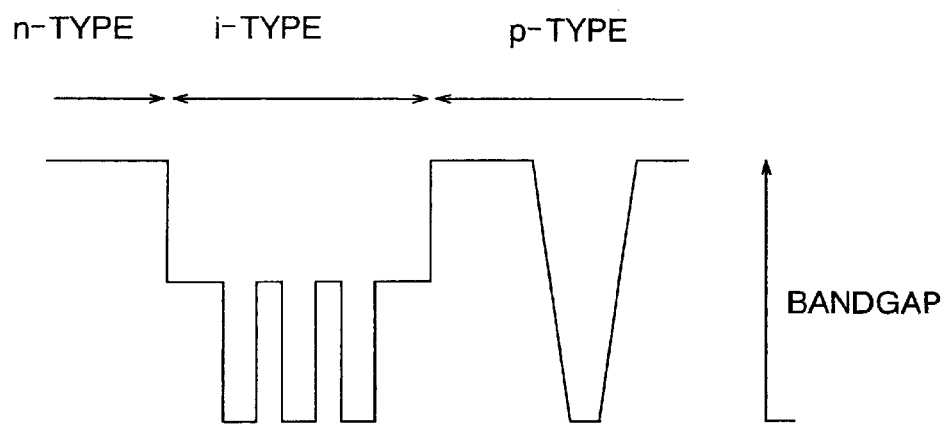
FIGS. 8A and 8B are a bandgap profile and a band structure diagram, respectively, of the laser device of FIG. 6.
Figure 8B:
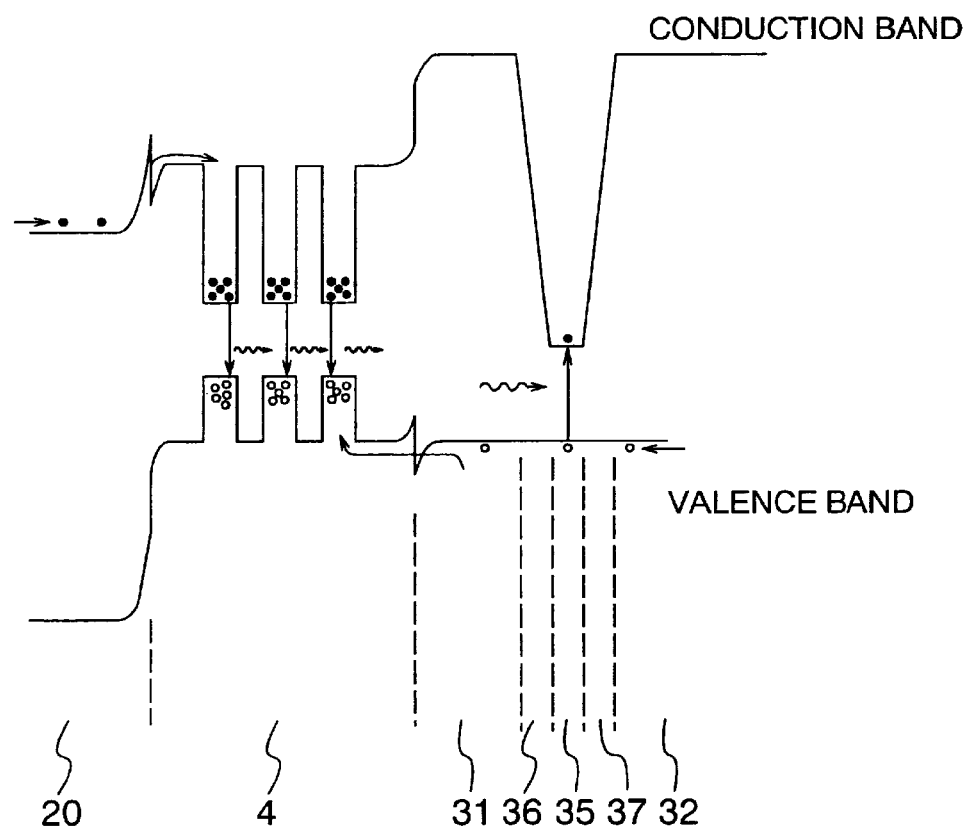

FIGS. 8A and 8B show, similarly to FIG. 5A and 5B, a bandgap profile and a band structure diagram, respectively, of the semiconductor laser device of the present embodiment. The composition profile of the laser device has no steep change in the layers from p-type cladding layers 31 to p-type cladding layer 32, thereby providing no steep change in the bandgap profile between both the sides of saturable absorbing layer 35, as shown in FIG. 8A. This is due to the continuous composition from p-AlGaInP cladding layer 31 to p-AlGaInP cladding layer 32 through p-type first buffer layer 36, saturable absorbing layer 35 and p-type second buffer layer 37. Accordingly, the valence band energy is continuous in this range, as shown in FIG. 8B, and is different from the valence band energy, shown in FIG. 5B, having spikes 311 and 312 which are due to the discontinuities of the valence band energy.

In operation of the semiconductor laser device of the present embodiment, holes do not stay in p-type saturable absorbing layer 35 and are injected toward the active layer 4 smoothly. As a result, lasing is effected in the active layer 4, not in the p-type saturable absorbing layer 35, which fact allows p-type saturable absorbing layer 35 to operate for designed saturable absorption, thereby enabling self-sustained pulsation of the laser device.

The samples of the present embodiment achieved a high yield of 80% for self-sustained pulsation at an ambient temperature of 60° C. and at up to 5 milli-watts. The samples exhibited a typical threshold current of 70 mA and a typical lasing frequency of 660 nm at a room temperature. The thickness of first and second buffer layers 36 and 37 may be independently varied between 0.5 nm and 100 nm in the embodiments depending on the design. Also, the parameters x may be varied depending on the design, although FIG. 7 shows typical values.

Further, although the compositions of the materials for the buffer layers 36 and 37 are exemplarily changed linearly in the present embodiment, it is not necessary to change the compositions linearly, so long as the compositions change monotonically.

It is sufficient that each of p-type cladding layer 31, first buffer layer 36, saturable absorbing layer 35, second buffer layer 37 and p-type cladding layer 32 has a hole density above $1 \times 10^{17}$ $cm^{-3}$, and that n-AlGaInP cladding layer 20 has a carrier (electron) density above $1 \times 10^{17}$ $cm^{-3}$. The active layer 4 is designed typically intrinsic, but may be of p-type or n-type due to diffusion of impurities from adjacent n-cladding layer 20 or p-type cladding layer 31.

The thickness of p-type cladding layer 31 may be any value between 0 and 500 nm, and the thicknesses of n-type cladding layer 20 and p-type cladding layer may 32 be any value above 200 nm. The Al mole fraction (x) of each cladding layer may be designed at any value between 0.5 and 1.0, so long as the Al mole fraction of optical guide layers 42 is lower than the Al mole fraction of the cladding layers.

The active layer 4 may be of any quantum well structure so long as the thickness of each quantum well layers 40 and barrier layers 41 is below 20 nm. The number of well layers may be any above or equal to 1. The quantum well layers may be non-strained, tensile-strained or compressive strained. The active layer 4 may be a single bulk layer. In addition, the thickness of the optical guide layers 42 may be any value between 0 nm and 200 nm.

Saturable absorbing layer 35 may have any Al mole fraction below 0.2, and may be non-strained, tensile-strained or compressive-strained. The thickness of saturable absorbing layer 35 is preferably designed in view of reduction of the quantum energy level and increase of the optical confinement coefficient, which are provided by interposition of buffer layers 36 and 37. For example, if saturable absorption is too large, the thickness of saturable absorbing layer 35 may be designed zero and p-type buffer layer 36 or 37 may have a saturable absorption function instead. In this text, the thickness of zero for a layer, zero for the saturable absorbing layer for example, means the absence of a single-function saturable absorbing layer 35 and the presence of a double-function adjacent layer 36 or 37 having both the saturable absorption function and the energy buffer function.

Figure 9:
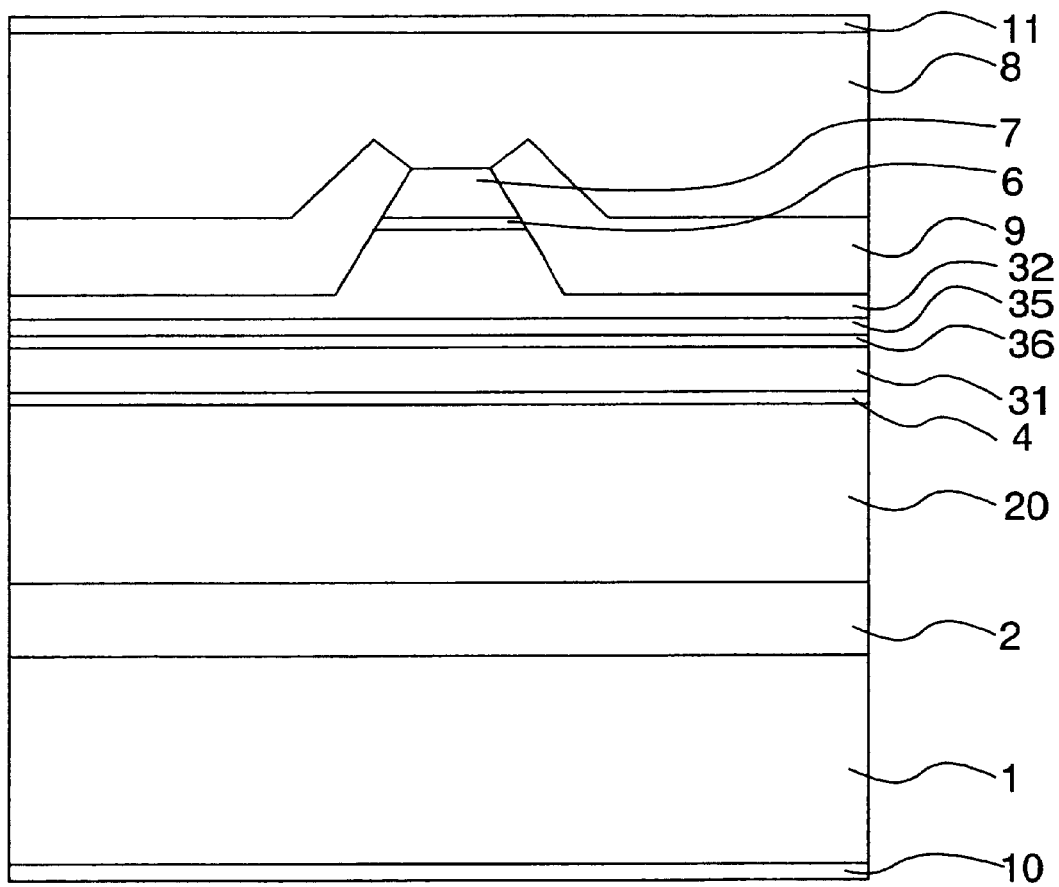
FIG. 9 is a cross-sectional view of a self-sustained pulsation semiconductor laser device according to a second embodiment of present invention.

FIG. 9 shows a self-sustained pulsation semiconductor laser device according to a second embodiment of the present invention, similarly to FIG. 6. The semiconductor laser device of the present embodiment is similar to the first embodiment except that p-type second valence band energy buffer layer (37 in FIG. 6) is not provided in the present embodiment.

Figure 10A:
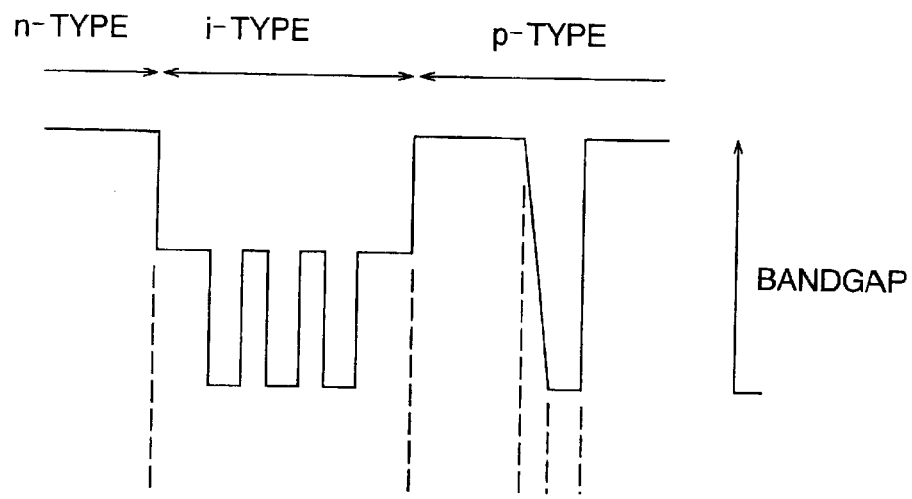
FIGS. 10A and 10B are a bandgap profile and a band structure diagram, respectively, of the laser device of FIG. 9.
Figure 10B:
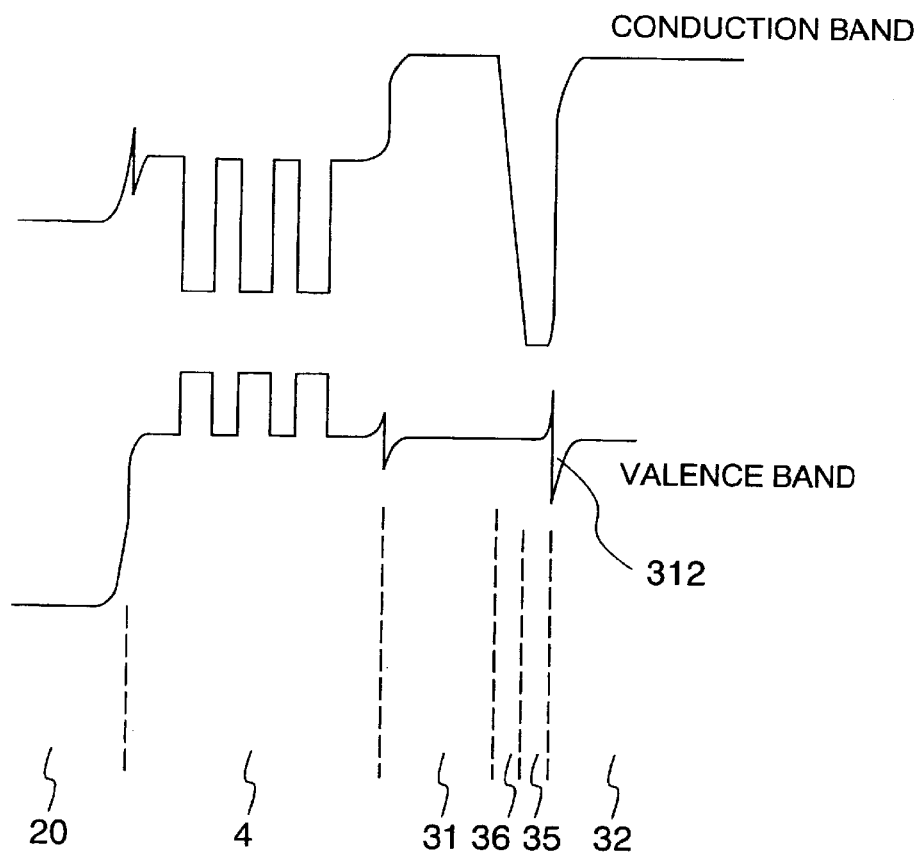

FIGS. 10A and 10B show, similarly to FIGS. 8A and 8B, a bandgap profile and a band structure diagram, respectively, of the laser device of FIG. 9. The present embodiment achieves prevention of excessive increase of saturable absorption due to the absence of second buffer layers. In FIGS. 8A and 8B of the first embodiment, although spike is not generated in the valence band energy on both sides of saturable absorbing layer 35, valence band energy buffer layers 36 and 37 each having a thickness of 5 nm or more reduces the quantum level and increases the confinement coefficient in saturable absorbing layer 35, thereby generating an excessive saturable absorption. In the present embodiment, absence of the second buffer layer prevents excessive saturable absorption.

The absence of second buffer layer causes generation of a spike 312 at the hetero-junction interface between saturable absorbing layer 35 and p-type cladding layer 32. Although the spike 312 retards injection of holes toward the active layer 4 to some extent, the holes do not stay in saturable absorbing layer 35 for a long time. As a result, lasing occurs in the active layer 4 and not in saturable absorbing layer 35, which fact provides a self-sustained pulsation with a high yield.

Figure 11A:
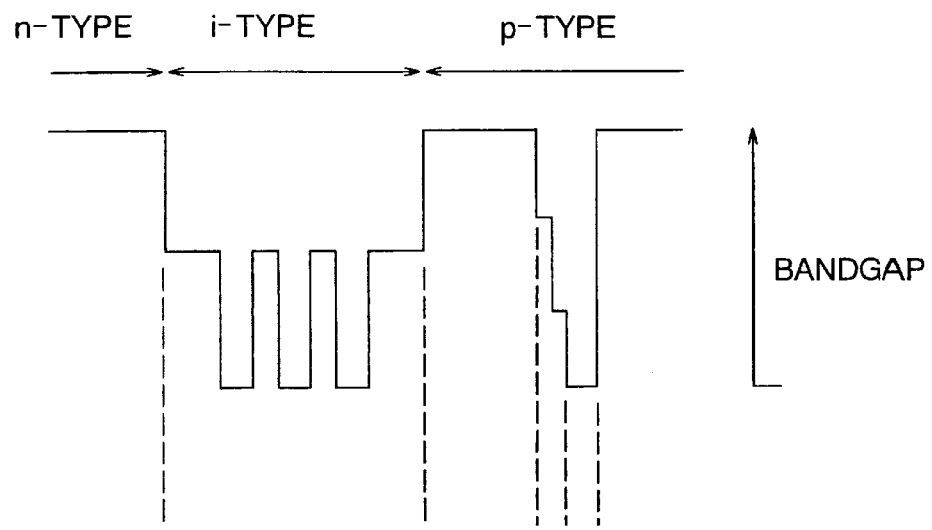
FIGS. 11A and 11B are a bandgap profile and a band structure diagram, respectively, of a self-sustained pulsation semiconductor laser device according to a third embodiment of the present invention.
Figure 11B:
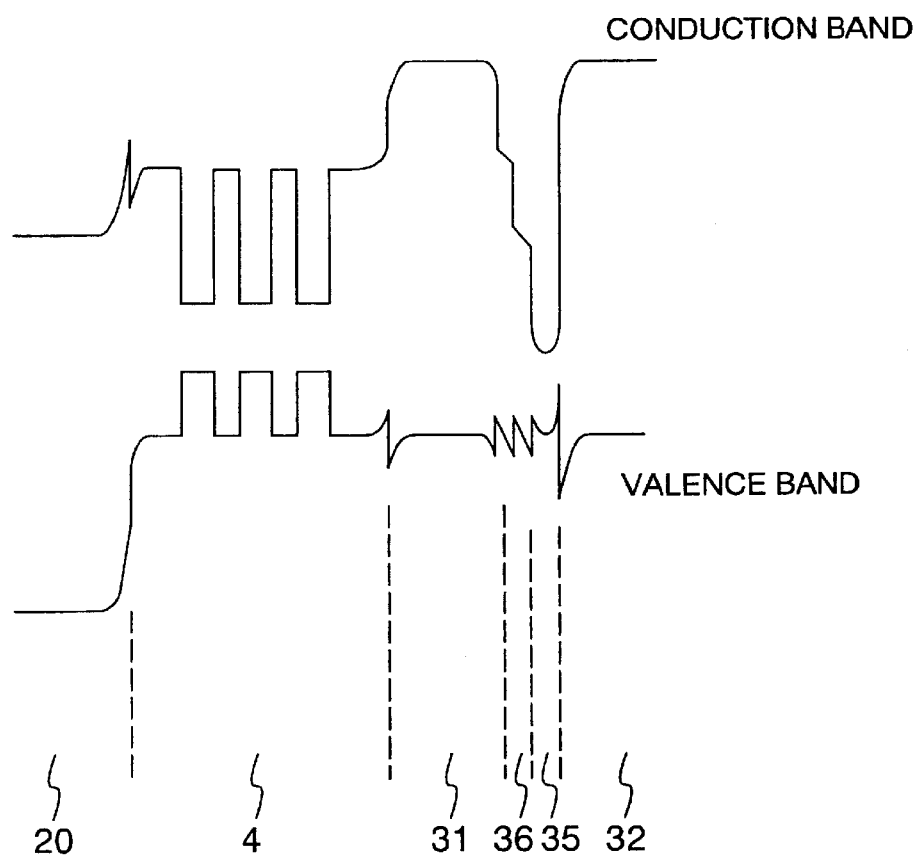

A semiconductor laser device according to a third embodiment is obtained by modifying the second embodiment so that the semiconductor materials for the buffer layer 36 disposed between saturable absorbing layer 35 and p-type cladding layer 31 have a valence band energy profile which falls stepwise from p-type cladding layer 31 toward saturable absorbing layer 35, thereby generating the bandgap profile as shown in FIG. 11A and the conduction band profile as shown in FIG. 11B. In these figures, a two-step rise is exemplified. That is, the buffer layer 36 has a two-layer structure having different compositions.

To fabricate semiconductor devices according to the first and second embodiments, a growth process is employed which is capable of accurately controlling the composition of the grown layer at desired values for obtaining desired valence band energies. On the other hand, in the third embodiment, the stepwise band energy profile allows the use of an economical growth method, wherein MOVPE or MBE process is conducted without an expensive sequence controller which is capable of accurately controlling the compositions of the grown layers.

As shown in FIG. 11B, although spikes in the valence band energy are not completely removed from saturable absorbing layer 35 and the interface between the same and p-type cladding layer 31, the magnitude of the spikes can be suppressed to effectively inject holes into the active layer 4. As a result, a self-sustained pulsation can be obtained with a high yield.

It is preferable that the number of energy steps in saturable absorbing layer 35 be large in the technical view point. However, the number of energy steps may be selected based on the fabrication process used. Although the buffer layer 36 has stepwise valence band energy levels in FIG. 11A, this configuration may be applicable to the buffer layer 37 having such stepwise valence band energy levels.

In the present invention, the manner in which the bandgap energy profile changes is not limited to the illustrated manner, i.e., either linearly, monotonically or stepwise, so long as it has a function for prevention of holes from staying locally in saturable absorbing layer 35.

Especially, if a strained quantum well layer is used as the saturable absorbing layer 35, it is possible that first and second buffer layers 36 and 37 are also made as strained quantum well layers, wherein the composition and the strain of both the buffer layers 36 and 37 are independently controlled so that the thickness of both the buffer layers 36 and 37 does not exceed the critical thickness.

Figure 12C:
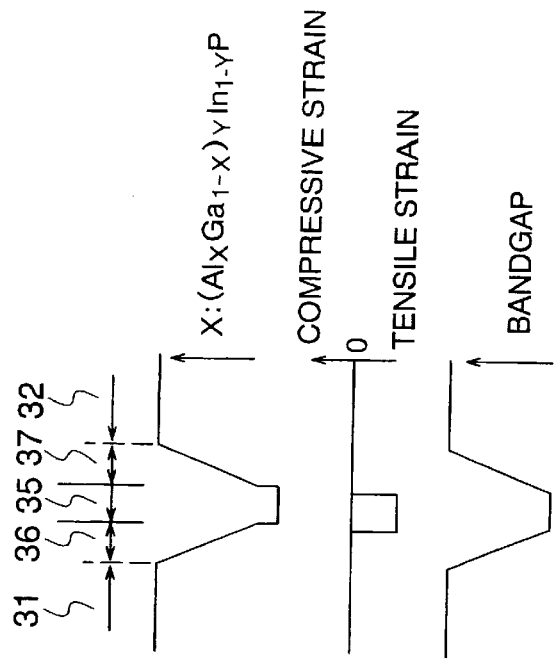
FIGS. 12A to 12C each illustrates the relationship of Al mole fraction, strain and bandgap of a self sustained laser device using a strained quantum well layers.
Figure 12A:
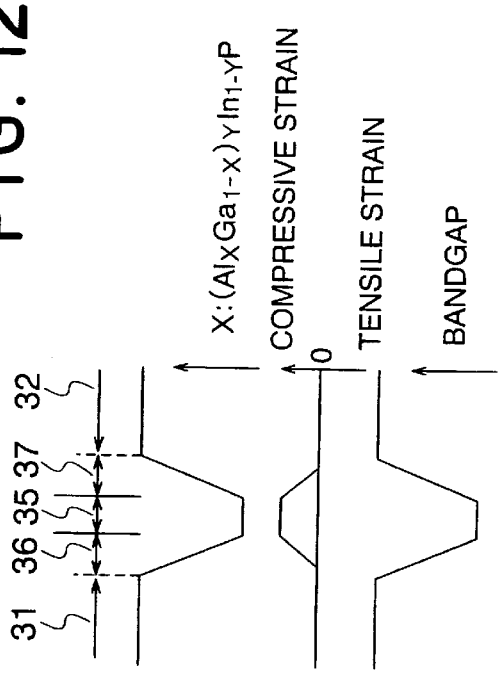
Figure 12B:
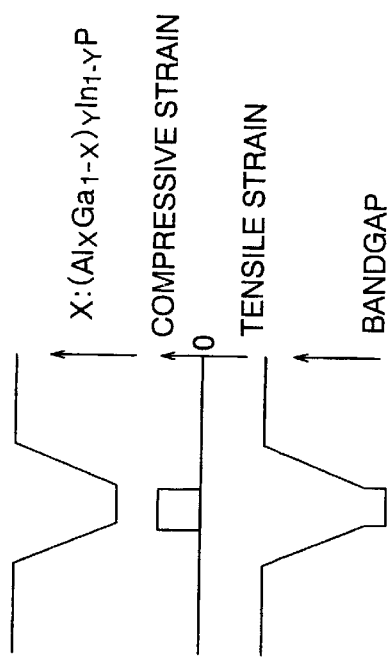

FIGS. 12A to 12C show Al mole fraction (x) profiles in $(Al_xGa_{1-x})_yIn_{1-y}P$, strain profiles and bandgap profiles in the layers from p-type cladding layer 31 to p-type cladding layer 32 when saturable absorbing layer 35 is formed as strained quantum well layer. First and second buffer layers 36 and 37 are provided between p-type cladding layer 31 and saturable absorbing layer 35 and between saturable absorbing layer 35 and p-type cladding layer 32, respectively.

When a strain profile wherein saturable absorbing layer 35 has a constant compressive strain and both buffer layers 36 and 37 have linearly decreasing compressive strains toward p-type cladding layers 31 and 32, respectively, is applied as shown in FIG. 12A, spikes do not appear in the bandgap profile, which allows a smooth injection of holes into the active layer 4. However, if the compressive strain applied to saturable absorbing layer 35 is too large, and the thicknesses of valence band energy buffers 36 and 37 exceed the critical thickness, large dislocations are generated to degrade the crystal structure of the semiconductor laser device, thereby reducing reliability thereof.

To solve the above problem relating to the critical thickness in the quantum well layer, the strain profile may be modified so that the compressive strain has discontinuity in the buffer layers, as shown in FIG. 12B. In this case, the buffer layers may have zero strain or small uniform strain. The discontinuity in the strain profile may generate some spikes at the interface between saturable absorbing layer 35 and buffer layers 36 and 37 due to difference in the valence band energy.

However, by providing monotonically changing profiles in Al mole fraction (x) in the buffer layers 36 and 37, the valence band energy difference between saturable absorbing layer 35 and the buffer layers 36 and 37 can be suppressed, which in turn suppresses the magnitude of the spikes, thereby achieving a relatively smooth hole injection.

To suppress the valence band energy difference between saturable absorbing layer 35 and the buffer layers 36 and 37 for achieving an excellent bandgap energy profile, a different configuration may be employed wherein Al mole fraction (x) is modified as shown in FIG. 12C. In this case, Al mole fraction is smaller in saturable absorbing layer 35 than that defined by the monotonically decreasing valence band energy in both the buffer layers 36 and 37, thereby canceling the discontinuity in the valence band energy shown in FIG. 12B to achieve a smooth hole injection as shown in FIG. 12C.

To achieve the monotonically changing bandgap profile, a design choice is directed to obtain a monotonically changing valence band energy in the semiconductor materials by controlling the Al mole fraction or the amount of strain so long as the physical properties of the layers are known. In short, the valence band energy buffer layers may be also called bandgap buffer layers.

In a modified embodiment from the second and third embodiments, n-GaAs current blocking layer 9 may be disposed in contact with saturable absorbing layer 35. In addition, a part of n-GaAs current blocking layer 9 may be replaced by AlInP layer, for example, to achieve a low threshold current for the self-sustained pulsation.

Since the above embodiments are described only for examples, the present invention is not limited to the above embodiments and various modifications or alterations can be easily made therefrom by those skilled in the art without departing from the scope of the present invention.

For example, although AlGaInP laser device is exemplified in the above embodiments, the present invention is applicable to AlGaAs semiconductor laser, AlGaInN laser or II-VI group semiconductor laser as well. Further, the saturable absorbing layer may be provided in the n-type cladding layer 20 in FIG. 6.

What is claimed is:

1. A semiconductor laser device comprising a first conductivity-type semiconductor substrate, and a first conductivity-type cladding layer, active layer and a second conductivity-type cladding layer consecutively formed on said semiconductor substrate, at least one of said first conductivity-type cladding layer and said second conductivity-type cladding layer including therein a saturable absorbing layer having first and second surfaces, a first buffer layer disposed in contact with said first surface of said saturable absorbing layer, and first and second cladding layer portions sandwiching therebetween said saturable absorbing layer and said first buffer layer, a semiconductor material for said saturable absorbing layer having a first bandgap energy which is lower than a second bandgap energy of a semiconductor material for said first and second cladding layer portions, a semiconductor material for said first buffer layer having an intermediate valence band energy between first valence band energy and second valence band energy.

2. A semiconductor laser device as defined in claim 1, wherein said first conductivity-type is an n-type, and said second conductivity-type is a p-type.

3. A semiconductor laser device as defined in claim 1, wherein said first surface of said saturable absorbing layer is a side adjacent to said active layer.

4. A semiconductor laser device as defined in claim 1, further comprising a second buffer layer disposed in contact with said second surface of said saturable absorbing layer.

5. A semiconductor laser device as defined in claim 1, wherein said semiconductor material for said first buffer layer has a valence band energy profile, which is substantially equal to said first valence band energy at a first buffer layer portion in contact with said saturable absorbing layer and equal to said second valence band energy at a second buffer layer portion in contact with one of said first and second cladding layer portions, and monotonically decreases from said second buffer layer portion toward said first buffer layer portion.

6. A semiconductor laser device as defined in claim 5, wherein said first buffer layer has a composition profile, which is equal to a first composition of said saturable absorbing layer at said first buffer layer portion and equal to a second composition of said cladding layer portion in contact with said first buffer layer at said second buffer layer portion, and an intermediate composition between said first composition and said second composition at a portion between said first buffer layer portion and said second buffer layer portion.

7. A semiconductor laser device as defined in claim 1, wherein said semiconductor material for said first buffer layer has a valence band energy profile stepwise increasing from a first buffer layer portion in contact with said saturable absorbing layer toward a second buffer layer portion in contact with one of said first and second cladding layer portions.

8. A semiconductor laser device as defined in claim 7, wherein said first buffer layer has stepwise changing composition between a first composition of said saturable absorbing layer and a second composition of said cladding layer in contact with said first buffer layer corresponding to said stepwise increasing valence band energy.

9. A semiconductor laser device as defined in claim 1, wherein each of said saturable absorbing layer and said first buffer layer is a strained quantum well layer, and said first buffer layer has a strain smaller than a strain of said saturable absorbing layer.

10. A semiconductor laser device as defined in claim 7, wherein said material for said first buffer layer has said first valence band energy.

11. A semiconductor laser device as defined in claim 1, wherein said first buffer layer has an intermediate composition between compositions of said saturable absorbing layer and said cladding layer portion in contact with said first buffer layer.

12. A semiconductor laser device comprising a first conductivity-type semiconductor substrate, and a first conductivity-type cladding layer, active layer and a second conductivity-type cladding layer consecutively formed on said semiconductor substrate, at least one of said first conductivity-type cladding layer and said second conductivity-type cladding layer including therein a saturable absorbing layer having first and second surfaces, a first buffer layer disposed in contact with said first surface of said saturable absorbing layer, and first and second cladding layer portions sandwiching therebetween said saturable absorbing layer and said first buffer layer, said saturable absorbing layer having a first bandgap energy which is lower than a second bandgap energy of said first and second cladding layer portions, said first buffer layer having an intermediate bandgap energy between said first bandgap energy and said second bandgap energy.

13. A semiconductor laser device as defined in claim 12, wherein said first conductivity-type is an n-type, and said second conductivity-type is a p-type.

14. A semiconductor laser device as defined in claim 12, wherein said first surface of said saturable absorbing layer is a near side to said active layer.

15. A semiconductor laser device as defined in claim 12, further comprising a second buffer layer disposed in contact with said second surface of said saturable absorbing layer.

16. A semiconductor laser device as defined in claim 12, wherein said first buffer layer has a bandgap energy profile, which is substantially equal to said first bandgap energy at a first buffer layer portion in contact with said saturable absorbing layer and equal to said second bandgap energy at a second buffer layer portion in contact with one of said first and second cladding layer portions, and monotonically decreases from said second buffer layer portion toward said first buffer layer portion.

17. A semiconductor laser device as defined in claim 16, wherein said first buffer layer has a composition profile, which is equal to a first composition of said saturable absorbing layer at said first buffer layer portion and equal to a second composition of said cladding layer portion in contact with said first buffer layer at said second buffer layer portion, and an intermediate composition between said first composition and said second composition at a portion between said first buffer layer portion and said second buffer layer portion.

18. A semiconductor laser device as defined in claim 12, wherein said first buffer layer has a bandgap energy profile stepwise increasing from a first buffer layer portion in contact with said saturable absorbing layer toward a second buffer layer portion in contact with one of said first and second cladding layer portions.

19. A semiconductor laser device as defined in claim 18, wherein said first buffer layer has stepwise changing composition between a first composition of said saturable absorbing layer and a second composition of said cladding layer in contact with said first buffer layer corresponding to said stepwise increasing valence band energy.

20. A semiconductor laser device as defined in claim 12, wherein each of said saturable absorbing layer and said first buffer layer is a strained quantum well layer, and said first buffer layer has a strain smaller than a strain of said saturable absorbing layer.

21. A semiconductor laser device as defined in claim 12, wherein said first buffer layer has said first bandgap energy.

22. A semiconductor laser device as defined in claim 12, wherein said first buffer layer has an intermediate composition between a first composition of said saturable absorbing layer and a second composition of said cladding layer portion in contact with said first buffer layer.

* * * * *